(12) United States Patent
Mondello et al.

(10) Patent No.: US 11,322,223 B2
(45) Date of Patent: May 3, 2022

(54) JTAG BASED ARCHITECTURE ALLOWING MULTI-CORE OPERATION

(71) Applicant: Micron Technology, Inc., Boise, ID (US)

(72) Inventors: Antonino Mondello, Messina (IT); Alberto Troia, Munich (DE)

(73) Assignee: Micron Technology, Inc., Boise, ID (US)

( * ) Notice: Subject to any disclaimer, the term of this patent is extended or adjusted under 35 U.S.C. 154(b) by 209 days.

(21) Appl. No.: 16/625,455

(22) PCT Filed: May 31, 2019

(86) PCT No.: PCT/IB2019/000467
§ 371 (c)(1),
(2) Date: Dec. 20, 2019

(87) PCT Pub. No.: WO2020/240229
PCT Pub. Date: Dec. 3, 2020

(65) Prior Publication Data
US 2021/0335444 A1    Oct. 28, 2021

(51) Int. Cl.
*G11C 11/4091* (2006.01)
*G11C 29/48* (2006.01)
*G11C 29/16* (2006.01)
*G11C 29/18* (2006.01)
*G11C 29/42* (2006.01)
*G11C 29/44* (2006.01)

(52) U.S. Cl.
CPC .......... *G11C 29/48* (2013.01); *G11C 11/4091* (2013.01); *G11C 29/16* (2013.01); *G11C 29/18* (2013.01); *G11C 29/42* (2013.01); *G11C 29/44* (2013.01); *G11C 2029/1802* (2013.01)

(58) Field of Classification Search
CPC ..................................................... G11C 16/06
USPC ......................................................... 365/201
See application file for complete search history.

(56) References Cited

U.S. PATENT DOCUMENTS 6,102,963 A * 8/2000 Agrawal .......... H03K 19/17704
365/185.33
6,535,963 B1 * 3/2003 Rivers ..................... H04L 45/16
365/189.15
(Continued)

OTHER PUBLICATIONS

International Search Report and Written Opinion for related PCT Application No. PCT/IB2019/000467, dated Feb. 27, 2020, 13 pages.

*Primary Examiner* — Min Huang
(74) *Attorney, Agent, or Firm* — Brooks, Cameron & Huebsch, PLLC

(57) ABSTRACT

The present disclosure includes methods and apparatuses comprising a memory component having an independent structure and including an array of memory cells with associated decoding and sensing circuitry of a read interface, a host device coupled to the memory component through a communication channel, a JTAG interface in the array of memory cells, and an additional register in the JTAG interface. The additional register is configured to store a page address associated with the array of memory cells, the memory component is configured to load the page address at the power-on of the apparatus, and the host device is configured to perform a read sequence at the page address.

21 Claims, 11 Drawing Sheets

(56) References Cited

U.S. PATENT DOCUMENTS

| | | | |
|---|---|---|---|
| 7,159,091 B1* | 1/2007 | Hatalkar | G06F 9/44573 |
| | | | 711/103 |
| 2004/0128596 A1 | 7/2004 | Menon et al. | |
| 2008/0098164 A1* | 4/2008 | Lee | G06F 12/0866 |
| | | | 711/103 |
| 2014/0164725 A1 | 6/2014 | Jang et al. | |
| 2017/0285988 A1* | 10/2017 | Dobelstein | G11C 8/12 |
| 2020/0135261 A1* | 4/2020 | Haraguchi | G11C 11/4072 |

* cited by examiner

JTAG BASED ARCHITECTURE ALLOWING MULTI-CORE OPERATION

PRIORITY INFORMATION

This application is a National Stage Application under 35 U.S.C. § 371 of International Application Number PCT/IB2019/000467, filed on May 31, 2019, the contents of which are incorporated herein by reference.

TECHNICAL FIELD

The present disclosure relates generally to memory devices, and more particularly, to apparatuses and methods for non-volatile memory management. More particularly, the present disclosure relates to a JTAG based architecture allowing multi-core operation in a non-volatile memory device.

BACKGROUND

Non-volatile memory can provide persistent data by retaining stored data when not powered and can include different topology of memory components. For instance, NAND flash memories and NOR flash memories may be considered equivalent circuits in terms of cells interconnections and reading structure, even if their performances are different.

A memory circuit having a NAND or NOR configuration may be realized adopting different technologies, for instance: floating gate (FG), charge-trapping (CT), phase change random access memory (PCRAM), self-selecting chalcogenide-based memories, resistive random access memory (RRAM), 3D XPoint memory (3DXP) and magnetoresistive random access memory (MRAM), among others.

Non-volatile Flash memories are today one of the fundamental building blocks in modern electronic systems, particularly for Real Time Operating Systems (RTOS), since they store code, firmware, O.S., applications and other software. The operation of non-volatile Flash memories is managed by an internal controller including an embedded firmware, such controller performing the required write/read/erase operations by manipulating the voltages and timing on the access and data lines.

The performances of Flash memories in terms of speed, consumption, alterability, nonvolatility and the increasing importance of system reconfigurability have pushed for their integration in System-on-Chip (SoC) devices. However, there are several non-volatile technologies used in SoC but the programming methodologies are requiring more space and the software is complicated in comparison to the past to full fill new regulations. This drawback is pushing toward the search of having more storage space with difficulties in integrating such a storage space in a SoC.

Moreover, embedded memory in System on Chips is more and more difficult to be managed when the lithography node is below 28 nm.

Therefore, there is a need for providing a new interface architecture that can be easily integrated in a SoC and improves the performances of the non-volatile memory portion while having a low initial latency in the first access, especially at system boot, and improving the overall throughput.

DETAILED DESCRIPTION

Figure 1:
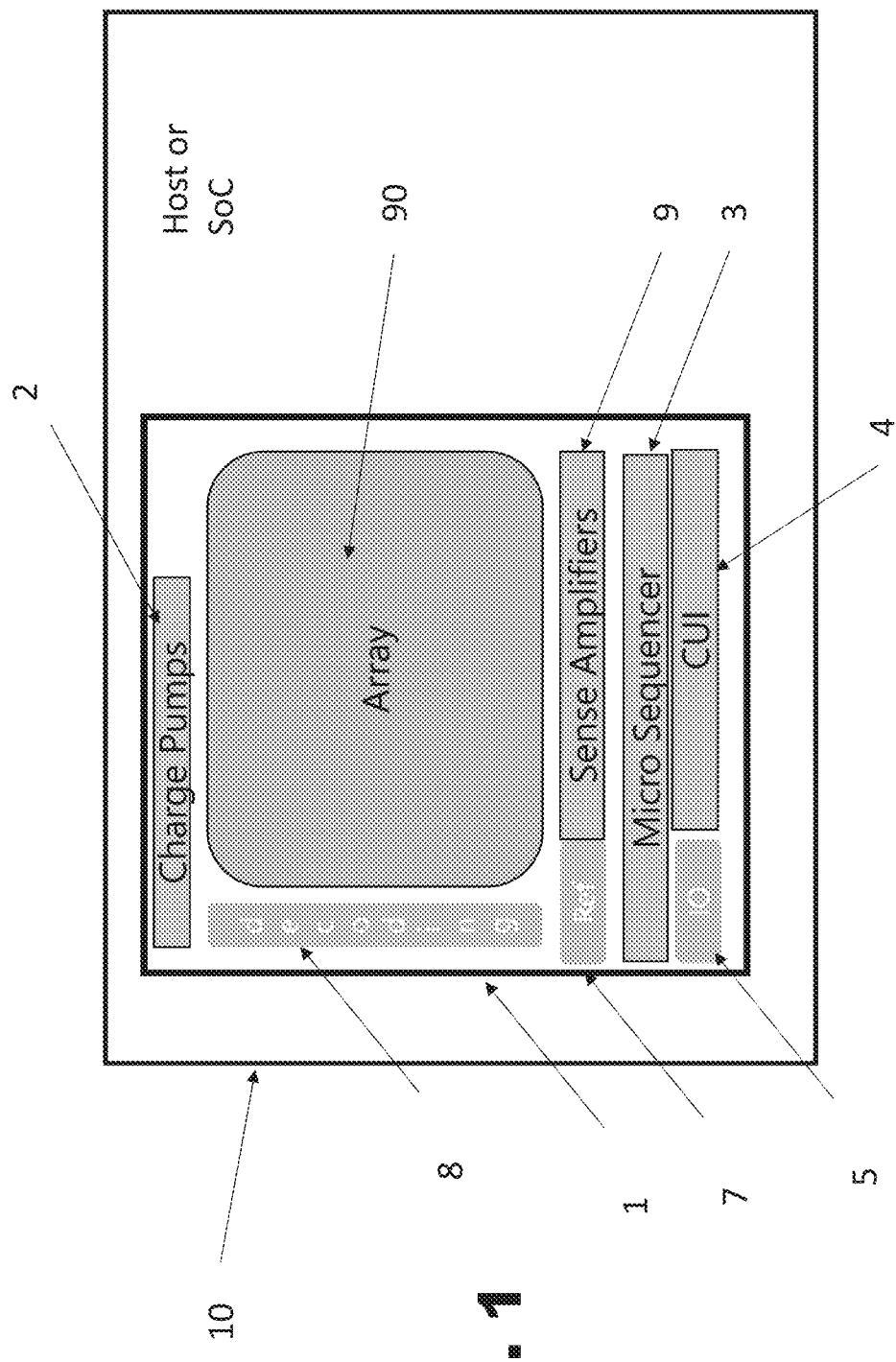
FIG. 1 shows a schematic view of a host device, for instance a System-on-Chip, coupled to a non-volatile memory component according to embodiments of the present disclosure.

The embodiments herein and the various features and advantageous details thereof are explained more fully with reference to the non-limiting embodiments that are illustrated in the accompanying drawings and detailed in the following description.

Descriptions of well-known components and processing techniques are omitted so as to not unnecessarily obscure the embodiments herein. The examples used herein are intended merely to facilitate an understanding of ways in which the embodiments herein may be practised and to further enable those of skill in the art to practice the embodiments herein. Accordingly, the examples should not be construed as limiting the scope of the embodiments herein.

More particularly, as it will be described into details in the following, an example apparatus comprises a memory component having an independent structure and including at least an array of memory cells with associated decoding and sensing circuitry of a read interface, a host device coupled to the memory component through at least a communication channel, a JTAG interface in said at least an array of memory cells, at least an additional register in said JTAG interface for handing data, addresses and control signals provided by the host device. The additional register is configured to store at least a page address associated with the array of memory cells, the memory component is configured to load said page address at the power-on of the apparatus, and the host device is configured to perform a read sequence at said page address.

With reference to those figures, apparatuses and methods involving a non-volatile memory device 1 or component and a host device 10 for such a memory device will be disclosed herein.

The host device 10 can be a System-on-Chip with an embedded memory component 1 or a more complex electronic device including a system coupled to a memory device, as will appear from the description of other embodiments of the present disclosure made with reference to other figures.

The present disclosure suggests improving the memory size by providing a structurally independent memory component 1 coupled to the host device 10 or System-on-Chip. The memory component 1 is structured as a stand-alone device realized in a single die with a technology specifically dedicated to the manufacturing of flash memory devices.

This non-volatile memory component 1 includes an array 90 of Flash memory cells and a circuitry located around the memory array and closer to a plurality of peripheral pads, as will be disclosed later. More specifically, the proposed external architecture allows to overpass the limit of the current eFlash (i.e. embedded flash technology) allowing the integration of bigger memory, as it can be 512 Mbit and/or 1 Gbit and/or more depending on the memory technology and technology node.

More particularly, the Flash memory component 1 includes an I/O circuit 5, a micro-sequencer 3 including a control and JTAG logic and sense amplifiers 9.

The Flash memory component 1 further includes a command user interface CUI 4, voltage and current reference generators 7, charge pumps 2 and decoding circuitry 8 located at the array periphery.

As previously reported, the memory portion 1 is an independent structure but it is strictly associated to the SoC structure 10. However, the manner in which the memory portion is coupled to the System-on-Chip is peculiar and will be evident in the following paragraphs.

While being advantageous under many aspects, the System-on-Chips including large memory arrays may suffer for many drawbacks since the memory portion is realized with a process not specifically designed for memories and possible defects of the memory array may compromise the life or the functioning of the whole SoC structure.

On the contrary, to improve the performances of the whole SoC structure the memory portion 1 has been realized as an independent memory device with a technology specifically dedicated to the manufacturing of flash memory devices. The memory component 1 is associated and linked to the SoC structure partially overlapping such a structure while the corresponding semiconductor area of the SoC structure has been used for other logic circuits and for providing support for the overlapping structurally independent memory portion 1.

The free space in terms of semiconductor area that has been obtained at the level of the System-on-Chip has been used for the integration of additional user's function.

The memory component 1 is obtained as an independent structure but it is strictly associated to the host device or to the SoC structure. More particularly, the memory device 1 is associated and linked to the SoC structure partially overlapping such a structure while the corresponding semiconductor area of the SoC structure has been used for other logic circuits and for providing support for the partially overlapping structurally independent memory device 1 for instance through a plurality of pillars, through silicon vias (TSV), or other similar alternative connections such as ball on grid or with a technology similar to Flip-Chip.

The pillars are realized in the semiconductor area previously dedicated to an embedded memory portion at the same level of the System-on-Chip and connected to the flash memory die.

In one embodiment of the present disclosure the disposition of the pads of the memory component 1 has been realized on a surface of the memory component at the periphery of the structurally independent Flash device. More specifically, the plurality of pads has been realized around the array so that when the memory component 1 is reversed and its pads are faced to corresponding pads of the SoC structure 10. The semiconductor area that in known System-on-Chip devices was occupied by an embedded non-volatile memory portion is now dedicated to the housing of the interconnecting pads corresponding to the pads of the memory component 1. A skilled in this art understands that other coupling methods can be adopted for instance pads over logic technology. The pads are built on top of the logic, similarly to the 3DNand implementing the CMOS circuit under the array (CUA technology).

Generally speaking, the memory component 1 has a size that is different if compared with the size of the SoC structure 10, such a size can be minor or greater. Referring to the term "partially overlapping" we intend that the memory component 1 covers partially or not completely the area of the SoC structure 10, or viceversa.

The coupling between the SoC structure 10 and the memory component 1 is realized interconnecting the plurality of respective pads or pin terminals that are faced one toward the other in a circuit layout that keeps the alignment of the overlapping pads even if the size of the memory component 1 should be modified.

Therefore, even a memory component 1 of a larger size may be supported and interconnected with the pads of the SoC structure 10 keeping the position and dislocation of the its interconnecting pads.

For completeness sake it should be remarked that the memory component 1 may be coupled to the SoC structure 10 with a Flip Chip technology or other equivalent coupling techniques.

The final configuration will be a face-to-face interconnection SoC/Flash Array with the sense amplifiers connected to the SoC in a Direct Memory Access configuration for user modes with high frequency accesses.

To read the memory cells of the Array 90 it is provided a dedicated circuit portion including an optimized Read Finite State Machine that is used to ensure high read performance, such as: branch prediction, fetch/pre-fetch, interrupt management. The error correction is left to the SoC 10; additional bits are provided to the memory controller to store any possible ECC data associated with the page. The ECC allow the host also to correct the received data. The host is responsible to fix the data in the memory based on the correction made in the received data cells.

All in all, the Flash memory component 1 of the present disclosure comprises: the memory array, a micro sequencer, a control and JTAG logic, sense amplifiers and corresponding latches.

This Flash memory component 1 uses the interconnection pads of the array and logic circuit portion to allow the interconnection with the host or SoC structure 10.

As shown before, the final configuration will be a face-to-face interconnection SoC/Flash Array, wherein the sense amplifiers 9 of the memory component 1 will be connected to the SoC in a Direct Memory Access configuration for user mode high frequency access.

The Direct Memory Access allows to reduce the final latency that the SoC can experience when reading the data. Moreover, the final latency is also reduced by the block form factor, the sense amplifiers distribution between blocks, the selection of the comparison threshold in the sense amplifiers and the optimized path.

Figure 2:
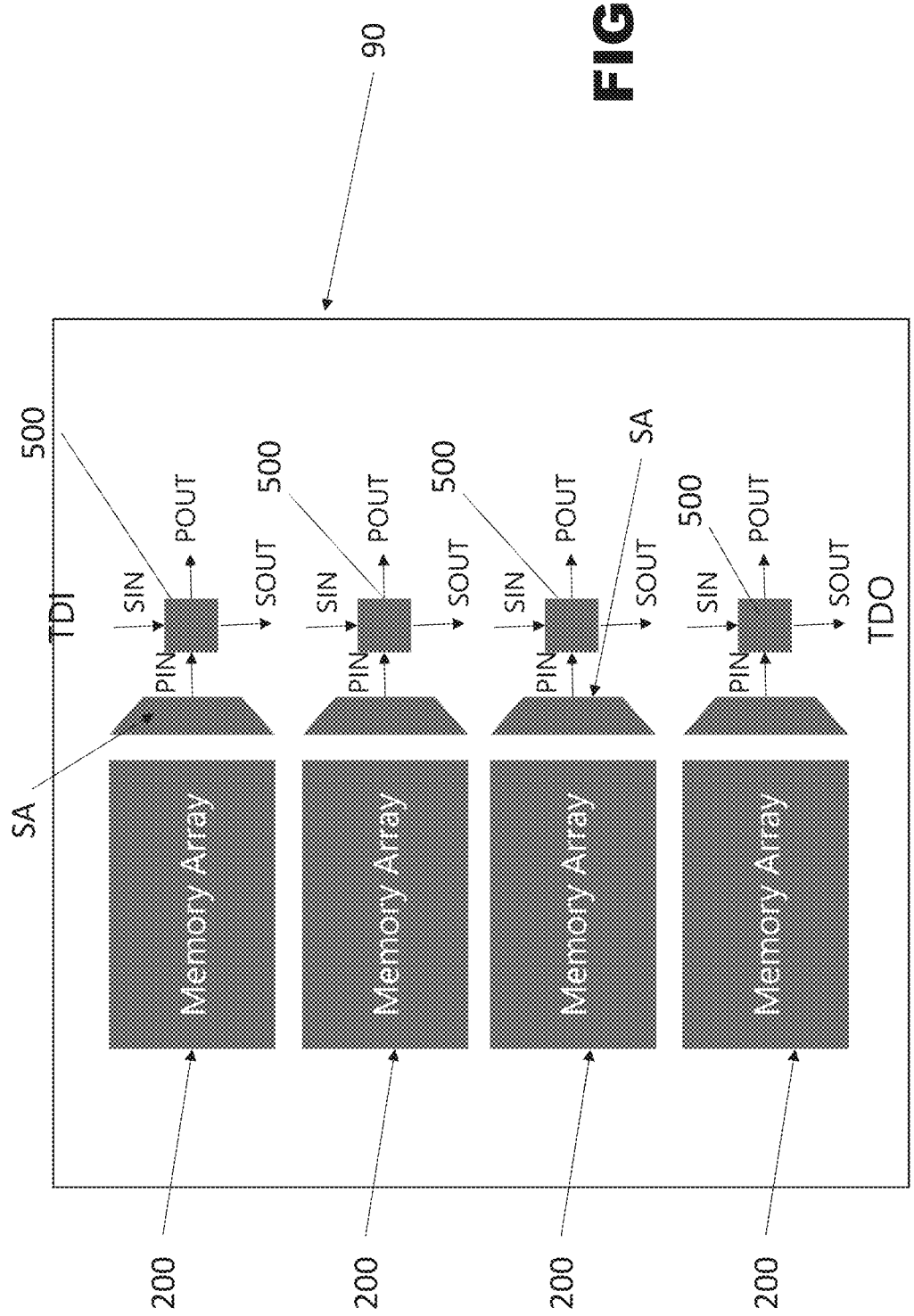
FIG. 2 is a schematic view of the internal layout of a memory portion of FIG. 1 according to one embodiment of the present disclosure.

Making now more specific reference to the example of FIG. 2, in one embodiment of the present disclosure the memory array 90 is built as a collection of sub arrays 200. In this manner, having smaller sectors if compared to known solutions the access time is significantly reduced and the whole throughput of the memory component is improved.

The advantage of this architecture is that it is very scalable and expanding and/or reducing the density of the final device translated only in mirroring a sub-array and generating the connection.

The host device or the System-on-Chip 10 normally includes more than one core and each core is coupled to a corresponding bus or channel for receiving and transferring data to the memory component 1. Each sub-array 200 has access to a corresponding channel to communicate with a corresponding core of the System-on-Chip.

The core of the host device can have access to the JTAG interface by using some internal pads. Such pads are high speed and have the capability to support the maximum frequency. Such pads however cannot manage analog voltage outside the flash array.

In embodiments of the present disclosure a Direct Memory Access (DMA) allows to reduce the final latency that the SoC can experience when reading the data.

To overcome the problems of flash memory devices embedded in System-on-Chips and obtaining a very low initial latency and high throughput, it has been designed a scalable, low-cost, effective and reliable memory apparatus and method involving completion of read operation with data, address and ECC by DMA flash array, ensuring that the data must be read from exactly the same memory location as the controller is asking for.

Figure 2A:
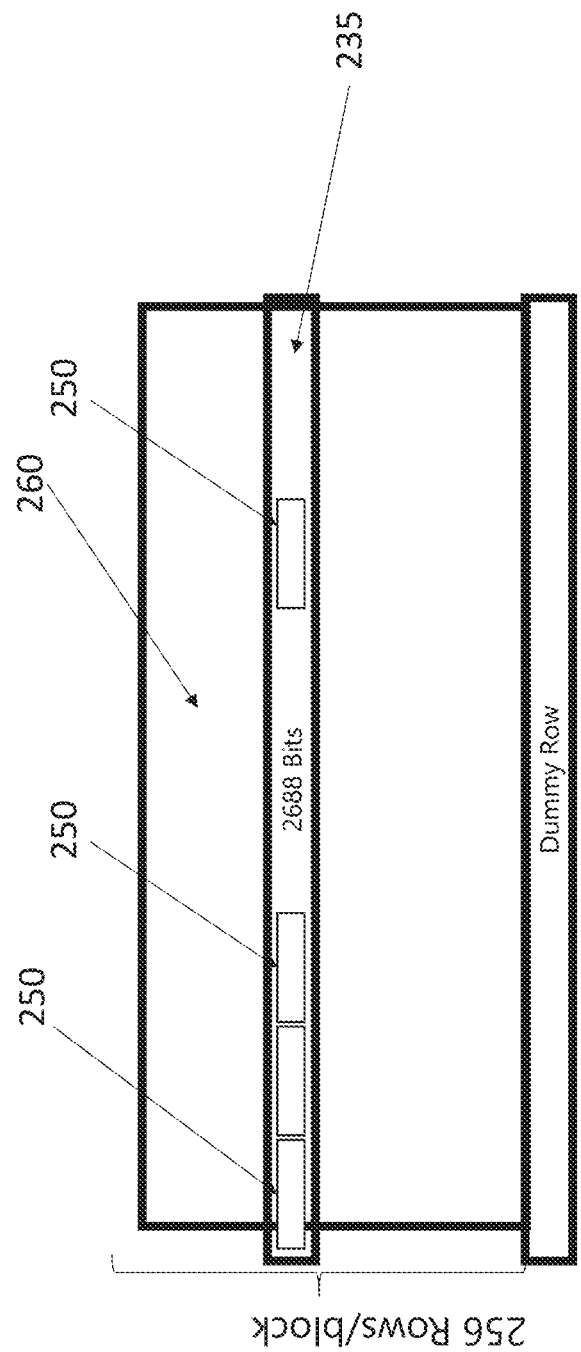
FIG. 2A is a schematic view of memory block formed by a plurality of rows of a memory array according to one embodiment of the present disclosure.

Moreover, in one embodiment of the present disclosure each memory sub array 200 is structured in memory blocks 260. The architecture of a memory block 260 comprising each location of the memory array may be defined as an extended page or super page 250, as shown schematically in FIG. 2A.

As non-limiting example, this extended page 250 comprises a string including a first group of at least N Bits, for instance one-hundred-twenty-eight (128) Bit for the I/O data exchange with the SoC device 200 plus at least a second group of M Bits, for instance twenty-four (24) address Bit and a final or third group of at least. R Bits, for instance sixteen (16) ECC Bit. The M address Bit (in the example the twenty-four address Bits) are sufficient to address up to 2 GigaBit of available memory space.

Said differently, the conventional atomic page of 128 bits used in each sub-array 200 to fill the communication channel with the SoC device has been enlarged in the present implementation to contain the stored address and the ECC.

According to the present disclosure, the outputs of the sense amplifiers SA prepare a double extended page at a time, i.e. a super-page 250 comprising a number of Bits given by the double combination of the above-mentioned three groups of data bits, address bits and ECC bits, according to the size of the memory array.

In the specific but non-limiting example disclosed herewith each extended page 250 includes at least 168 Bit obtained by the combination of the above three groups of N+M+R=128+24+16 data, address and ECC Bit and each super-page is formed by a couple of extended pages, i.e. a group of 168×2 Bits.

Just to give a non-limiting numeric example, each row of a memory block 260 includes sixteen extended pages. Therefore, the resulting row includes 2688 Bit coming out from the combination of sixteen extended pages independently addressable and each including 168 Bit or, said differently, the combination of eight super-pages.

In embodiments of the present disclosure the output of a generic sub-array is formed combining the following sequence: N data cells plus M address cells plus R ECC cells. In this non-limiting example, the total amount of Bits would involve 168 pads per channel.

The combined string of data cells+address cells+ECC cells allows implementing the safety coverage of the bus according to the standard requirements, because the ECC covers the whole bus communication (data cells+address cells), while the presence of the address cells provide the confidence that the data is coming exactly from the addressed location of the controller.

Figure 3:
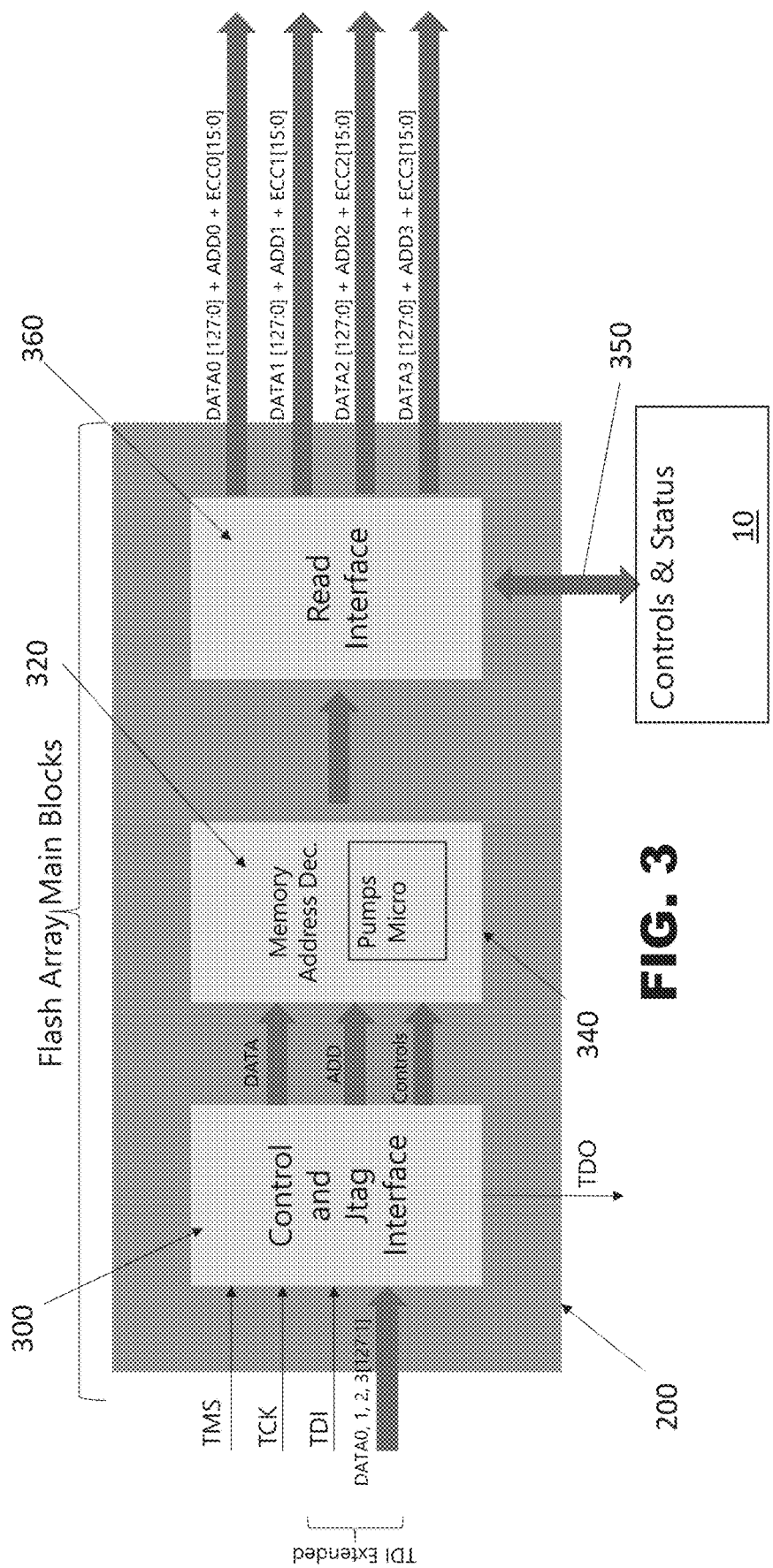
FIG. 3 shows a schematic view of a portion of the non-volatile memory component of FIG. 1 including a layout configuration according to the present disclosure.

Now, with more specific reference to the example of FIG. 3, the main structure of the memory component 310 according to an embodiment of the present disclosure will be disclosed, wherein the reference 310 of FIG. 3 corresponds to the reference 90 of FIG. 2.

The memory component 310 includes at least: an I/O circuit, a micro-sequencer, an array of memory cells 320, an array peripheral, a charge pump architecture, address decoders, sense amplifiers and corresponding latches, a service logic to connect all the parts of the memory, and a command user interface, for instance a CUT block.

The array of memory cells 320 includes non-volatile Flash memory cells.

In one embodiment of the present disclosure, the memory component 310 implements a Direct Memory Access type of memory to replace the embedded memory array of known SoC devices.

Moreover, the disclosure provides for the implementation of the memory component 310 in a "Known Good Die" (KGD) form factor or bare die, that allows connecting the sense amplifier outputs, except for a latch structure in the middle, directly with a controller of the SoC structure.

Moreover, a JTAG interface 350 is adopted for the test of the memory component 310, allowing the re-use of the testing tooling. Therefore, the memory component 310 also comprises a JTAG logic 350. This JTAG interface 350 will be disclosed later in more details with reference to FIG. 8.

Figure 8:
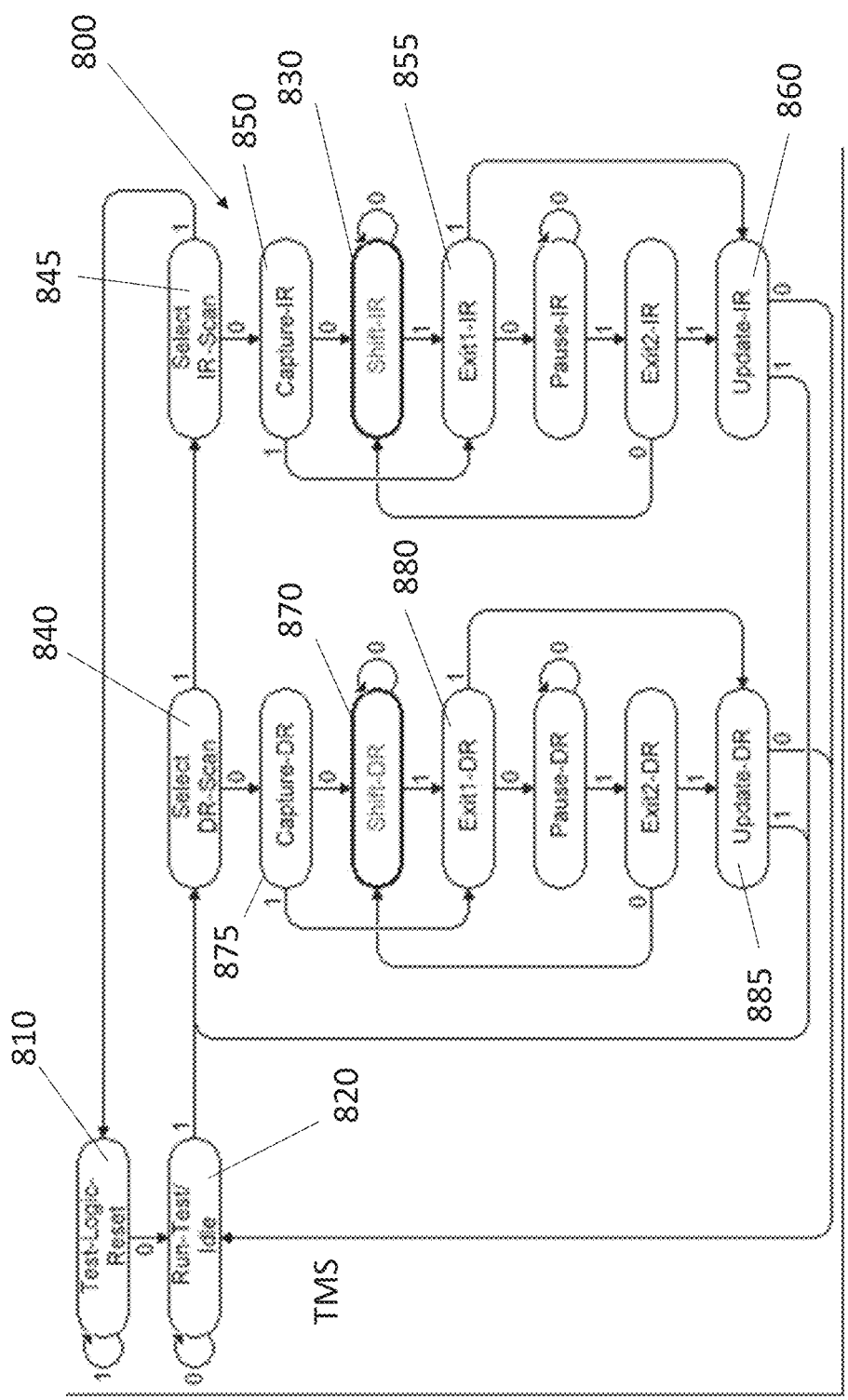
FIG. 8 shows a diagram reporting the operations of a Finite State Machine based on the JTAG protocol.

In more details, each memory array includes at least a JTAG interface 350 receiving as inputs standard JTAG signals: TMS, TCK, TDI as well as data from a memory page, as shown in FIG. 8. According to embodiments of the present disclosure, an extended TDI is used as flexible TDI. The flexibility is due to the fact that the number of parallel bits working as TDI are depending from the selected registers, i.e. K (four, in the example) lines for the instruction register, M lines for the address register, N lines for the data register, etc. while TDI comes from the JTAG protocol that uses TDI as name on the signal used to fill the registers.

This JTAG interface 350 produce as output data, addresses and control signals that are transferred to a memory address decoder 340 and also to the internal flash controller 300 to perform modify, testing, verification operations.

The activity of the decoder 340 is allowed by charge pumps 330 structured to keep secret the voltages and timings to manage the array. The decoding phase drives the data lines while the charge pumps provide the high voltage routed by the address decoder in the selected data lines.

This decoder 340 addresses the selected memory block. The address decoder is connected to the array to select the proper data lines, i.e. row and column for each super page. the read, modify and any other operations are using the address decoder to properly address bytes in the memory array.

A memory block is connected to the sense amplifiers and the sense amplifiers of the read interface 360 are connected to the SoC device 200 using modified JTAG cells. The communication channel between the flash array blocks and the SoC device 200 is represented by a control and status bus.

The output of the read interface 360 is represented by an extended page including the combined string of data cells+ address cells+ECC cells. The write operation also drives the three components (data cells+address cells+ECC cells) of the extended page; the ECC and the address cells serves as a safety mechanism to ensure the low probability to make mistakes.

The total amount of Bits would involve in the example disclosed herewith N+M+R Bits, for instance one-hundred-sixty-eight pads per channel in the implementation disclosed herewith.

The memory component 310 uses the interconnection pads and the logic circuit portion to allow the interconnection with the SoC structure 200.

The final configuration will be a face-to-face interconnection SoC/Flash Array, wherein the sense amplifiers of the memory component 310 will be connected to the SoC in a Direct Memory Access configuration. The interconnections also include the JTAG interface and control pins for testing and other purposes.

In this manner it is possible to keep relatively low the number of required interconnections, for instance in this particular disclosure within the range of 600 to 650 pads but a larger of lower number could depend on the implementation.

The memory array 320 of the memory component 310 is built as a collection of subarrays. The scan chains can be connected to form a unique shift register to proper test the interconnections.

The advantage of this architecture is that it is very scalable, wherein expanding and/or reducing the density of the final device translates only in mirroring a sub-array and providing the corresponding interconnections in a very scalable manner. The memory can be expanded also increasing the memory size per sub array, without enlarging the number of channels for the SoC.

The Direct Memory Access allows to reduce the final latency that the SoC can experience when reading the data.

Moreover, the memory component 310 is equipped with a controller 300 of the flash array 320 (hereinafter referred to as Flash array controller), said flash array controller 300 having an architecture that allows sharing some flash array resources with the SoC controller without compromising the secrecy of certain information stored therein (for example, algorithms, flash array voltages, currents, and more in general process information) and guarantees eventual customer return management.

The outcome of the memory blocks 260 is driven directly by the host device or SoC 10 without using high power output buffers of the known solutions and optimizing the path thanks a modified and optimized JTAG interface.

The outputs of the sense amplifiers SA per sub array 200 are latched by an internal circuit of a read interface. The memory structure can be expanded to allow multi-page read while shifting out the already read page.

The sense amplifiers SA are connected directly to a modified JTAG cells, that will be later disclosed, so to integrate a JTAG structure and the sense amplifiers in a single circuit portion. This allows reducing as much as possible the delay in propagating the output of the memory array to the SoC.

As previously said, the internal sense amplifiers 9 are preparing two pages of at least 128 bits and while the first page is ready to be shifted, internally it is performed a further read operation of a second page associated with the same address. This allows to prepare from five to eight double word, that are typical in the RTOS application allowing the sense amplifiers to execute a further internal read operation to prepare the second nibble or group of 128 Bits, if the system is structured with two pages of 128 Bits. This is the reason for having chosen a double page of 2×128 bits plus corresponding addresses and ECC Bits. i.e. 168 Bits.

This second part of four double words is transferred to the output of the flash array 90, using an additional enabling signal (i.e. an internal clock signal or an ADV signal) that transfers the content read at sense amplifier level to the host device or SoC device 10. The signal names are load-data [0, 1] . . . there is no need of incrementing the address when using the super page.

Figure 4B:
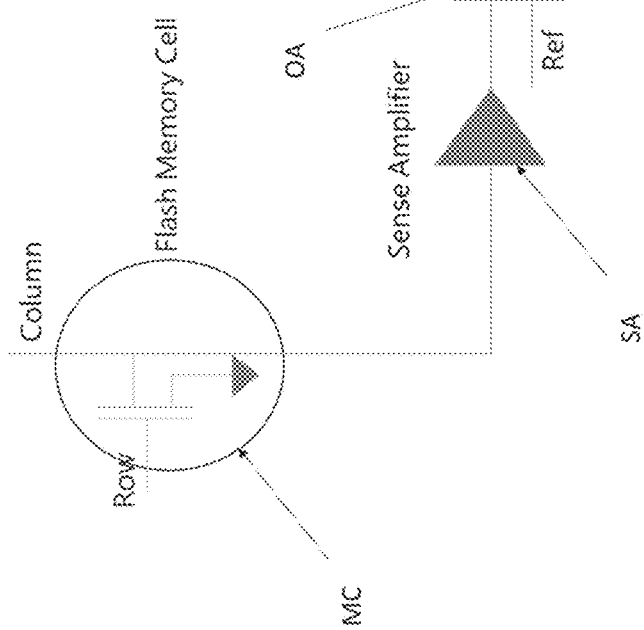
FIG. 4B is a schematic view of the connections between a generic memory cell and a corresponding sense amplifier with the inclusion of the modified JTAG cell according to the present disclosure.
Figure 4A:
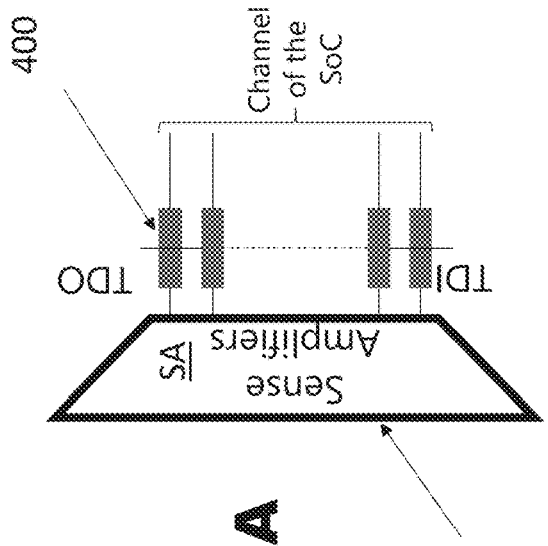
FIG. 4A is a schematic view of a particular of the memory portion shown in FIG. 2.

FIG. 4A shows a schematic view of a memory portion wherein the subarray 200 architecture is structured to serve at least a channel of the SoC structure 10 to which the memory component 1 is associated.

The sense amplifiers SA are connected directly to a modified JTAG cells 500, that will be later disclosed with reference to FIG. 5, so to integrate a JTAG structure and the sense amplifiers in a single circuit portion. This allows reducing as much as possible the delay in propagating the output of the memory array to the SoC.

The sense amplifiers SA of each sub array 200 are connected with the scan-chain 400 of modified JTAG cells 500, connecting together all the output of one sub-array 200. Moreover, the sub array scan-chains 400 can be connected to form a unique chain for quickly checking the integrity of the pads interconnections.

The JTAG Cell 500 is connected in the following manner shown in FIG. 4B:

PIN→output of a sense amplifier
POUT→to the SoC correspondent Data I/O
SIN→is the serial IN input connected to the SOUT of the previous sense amplifier
SOUT→is the serial output connected to the SIN of the next sense amplifiers The scan chain 400 made by the interconnected JTAG cells 500, using the serial input and output, has some advantages:

be able to test the successful interconnection between the SoC and the Direct Memory Access (DMA) Memory;
be able to implement digital test of the sense amplifiers, because the cell can work as program load to store the data inside the array;
be able to work as second level of latches.

We will see later in the present disclosure that when the first group of data Bits are ready to be transferred to the parallel output POUT of the sense amplifier, there is an internal latch coupled to the sense amplifier that can trigger the read data of the subsequent section of the remaining data Bits.

Still making reference to the examples of the FIGS. 4A and 4B we may consider the interconnections of each JTAG Cell 500: PIN is coupled to the output of a sense amplifier; POUT is coupled to the corresponding Data I/O of the host device 10 (i.e. the System-on-Chip); SIN is the serial IN input connected to the ROUT of the previous sense amplifier while SOUT is the serial output connected to the SIN of the next sense amplifier.

For instance, the schematic example of FIG. 4B shows a schematic and generic memory cell MC which is located at the intersection of a row of memory cells and a column of memory cells in a matrix of cells of a generic sub-array, so that the cell can be addressed accordingly. The real implementation can contain additional circuits from the cell to the output of the SA but they are not shown not being relevant for the purpose of the present disclosure.

A sense amplifier SA is coupled to the column of memory cells as part of the read circuitry that is used when a data is read from the memory array. Generally speaking a memory word including the above-mentioned super page 150 is read at a time and in the present example we will make reference to a memory word including data+address+ECC Bits.

As is well known, the role of the sense amplifier is that of sensing the low power signals from the array row. The low voltage values representing the logic data Bit (1 or 0, depending on conventions) stored in the memory cell MC are amplified to a recognizable logic level so the data can be properly interpreted by logic circuit portions outside the memory.

In the example disclosed herewith the output of each sense amplifier SA is coupled to the modified JTAG cell 500 so to integrate a JTAG structure and the sense amplifier.

In the non-limiting example disclosed herewith an output amplifier OA is interposed between the sense amplifier SA and the JTAG cell 500.

Thanks to the memory architecture of the present disclosure it is possible to pass from a parallel mode for retrieving data and addresses from the memory sub arrays 200 to a serial mode for checking the interconnections between the memory component 1 and the associated host device 10. Moreover, the SoC is entitled read once '1' and once '0' to perform tests and can also analyze the memory outcome, scanning out the data using the scan-chain.

The transition from the parallel to the serial mode is managed by the control and JTAG interface 300. However, the implementation of these dual mode operations is allowed by the specific structure of a modified. JTAG cell 500 disclosed hereinafter.

Figure 5:
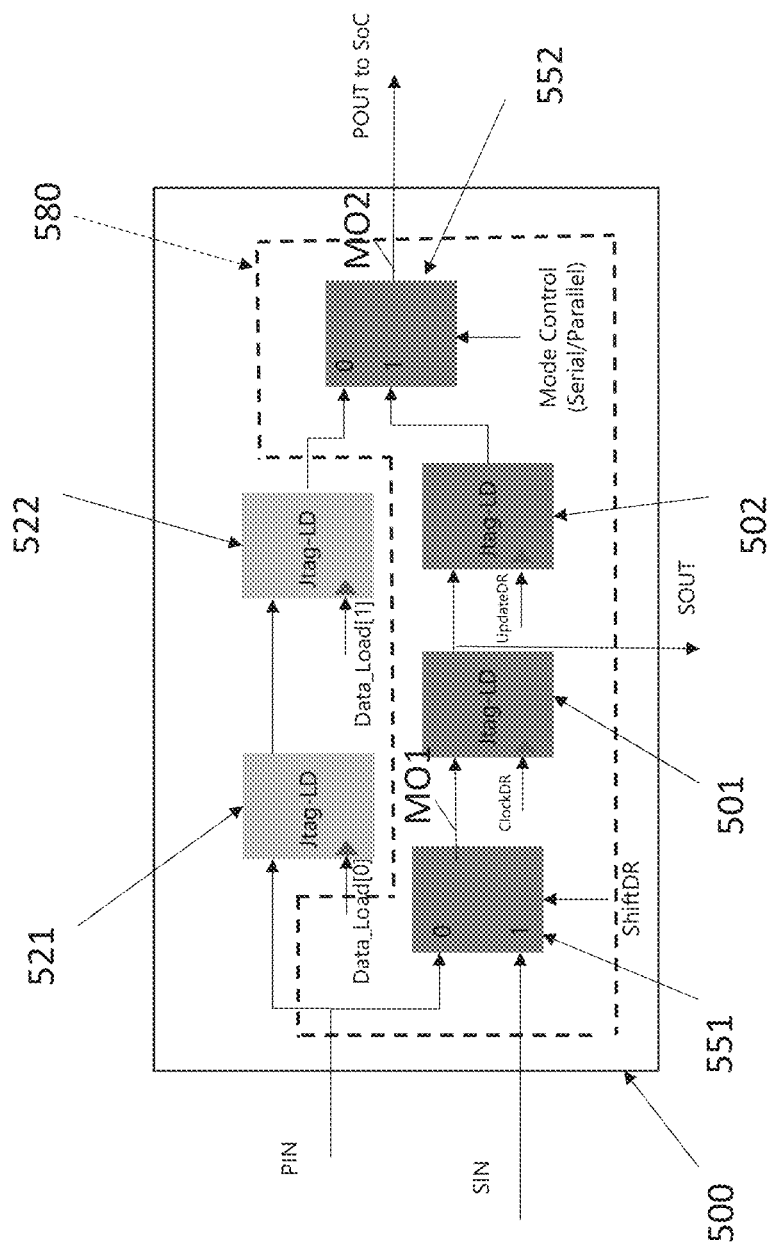
FIG. 5 is a schematic view of JTAG cell that has been modified according to the present disclosure.

Making reference to the schematic example of FIG. 5 it is shown a JTAG cell 500 modified according to the present disclosure.

The JTAG cell 500 has a first parallel input PIN terminal and a first serial input SIN terminal receiving corresponding signals Pin and Sin. Moreover, the JTAG cell 500 has a first parallel output terminal POUT and a first serial output terminal SOUT. The scan-chain 400 allows outputting the whole 256 bits, because the first group is read directly from the output while the second group is prepared in the back.

SOUT is connected to the JTAG latch close to the multiplexer that has as selector the signal: Mode Controller (serial/parallel). Basically the wire connected to the input '1' of this multiplexer is also the SOUT.

As shown in FIG. 5 the JTAG cell 500 may be considered a box with two input terminals PIN and SIN and two output terminals POUT and SOUT. The input terminal PIN is a parallel input while the input terminal SIN is a serial input.

Similarly, the output terminal POUT is a parallel output while the output terminal SOUT is a serial output.

Thanks to the serial input and output a testing process may be performed to check that no fault connection is present between the memory component 1 and the associated System-on-chip 10. Thanks to the parallel input and output the same JTAG cell is used as data buffer for the completing the reading phase through the sense amplifiers SA.

The JTAG cell 500 comprises a boundary scan basic cell 580 including a couple of latches 501 and 502 and a couple of multiplexer 551 and 552. A first input multiplexer 551 and a second output multiplexer 552.

The boundary scan basic cell 580 is indicated by the dotted line box in FIG. 5 and is a two inputs cell, with a serial input corresponding to SIN and parallel input corresponding to PIN, and two outputs cell with a serial output corresponding to SOUT and a parallel output corresponding to POUT.

The first multiplexer 551 receives on a first input "0" a parallel input signal Pin from the first parallel input terminal PIN and on a second input "1" a serial input signal Sin from the first serial input terminal SIN.

This first multiplexer 551 is driven by a control signal ShiftDR and has an output MO1. The cell 500 has two parallel outputs, i.e. MO1 and MO2. When the JTAG clock arrives, the serial output is driven out from the SOUT. SOUT is connected to the JTAG latch close to the multiplexer that receives a selector signal: Mode Controller (serial/parallel). Basically, the output of the latch connected to the input '1' of this multiplexer MO2 is also the SOUT.

The first multiplexer output MO1 is connected to a first input of the first latch 501 that receives on a second input terminal a clock signal ClockDR.

The first latch 501 is connected in chain to the second latch 502 with a first output of the first latch 501 connected to a first input of the second latch 502.

It is important to note that the output of the first latch 501 is also the serial output sour of the whole JTAG cell 500.

A second input terminal of the second latch 502 received a signal UpdateDR.

The second latch 502 has an output connected to an input of the second multiplexer 552, in particular to its second input.

This second multiplexer 552 is controlled by a Mode Control signal that allows to switch the whole JTAG cell 500 from a serial to a parallel mode and viceversa.

In one embodiment of the present disclosure the JTAG cell 500 further includes another couple of latches 521 and 522 provided between the parallel input Pin and the second multiplexer 552. These extra latches 521 and 522 are the latching of the direct read, i.e. first group of data Bits, and the shadow one, i.e. second group of 128 data Bits. In other words, the JTAG cell 500 includes the boundary scan cell 580 and at least the further latches 521 and 522.

We will refer hereinafter to these further latches as a third latch 521 and a fourth latch 522. In other embodiments a longer chain of latches may be used.

More particularly, the third latch 521 and the fourth latch 522 are connected in a small pipeline configuration with the third latch 521 receiving on a first input the parallel input signal Pin from the first parallel input terminal PIN and receiving on a second input a signal Data_Load[0] corresponding to a first data load.

The fourth latch 522 receives on a first input the output of the third latch 521 and receives on a second input a signal Data_Load[1] corresponding to a subsequent data load.

The output of the fourth latch 522 is connected to the first input "0" of the second multiplexer 552 that produces on its output terminal MO2 the output signal for the parallel output terminal POUT.

If compared to a conventional JTAG cell the JTAG cell 500 of the present disclosure may be considered a modified JTAG cell because of the presence of the two extra latches, the third and fourth latches 521 and 522, beside the presence of the boundary scan cell 580.

Now, we have to imagine that a JTAG cell 500 is coupled to the output of each sense amplifier SA of the memory sub-array 200. As usual, the memory array provides for a sense amplifier for each column of memory cells, as shown in FIG. 4B.

In the embodiment of the present disclosure all the JTAG cells 500 coupled to the sense amplifiers of a memory sub-array are to be considered a data buffer including a data page, including in this example at least one-hundred-and-twenty-eight (128) Bits for the reading of a combined memory page at a time from the four sub arrays 200.

However, as previously reported, the communication channel between the memory component and the SoC structure may need up to 256 Bits at a time (i.e. two combined memory words) and the JTAG cell 500 has been modified just to duplicate the internal latches to be able to shift the first or higher portion of the 128 Bits of the data to be read with the second or lower portion of the data to be read. Obviously, in this contest "higher" means the data portion that is loaded before while "lower" means the data portion that is loaded after.

A skilled in this art will understand that the number of internal latches of the modified JTAG cell 500 can be augmented in case of need to improve the number of Bits to be transferred to the SoC structure through the communication channel. For example, the above structure may be expanded accordingly to the size of the page required by the particular implementation of the memory controller.

Just to explain the manner in which data are transferred in the data buffer we have to imagine that when a data is loaded in the one of the two latches 521 or 522, the other latch is in a stand-by state but ready to receive the subsequent data portion.

Therefore, the first section including 128 Bit is transferred to the SoC structure for a first data elaboration while the reading phase is not stopped since the other portion of 128 Bits are prepared to be loaded into the latches at the subsequent clock signal.

In this example, each data buffers contains 128 modified JTAG cells 500 and the common Data_Load[1:0] are signals generated to allow to capture the whole 256 Bits, that is to say: eight double words DWs according to the proposed implementation (four sub arrays for each double word).

The signal generation is internally controlled when the read operation is performed in a specific data buffer and the signals are controlled by the SoC structure to allow performing read phase using a 128 Bits parallelism.

The main benefit of this memory architecture is that each buffer can contain the whole double words DWs thus leaving free the sense amplifier to read in another memory location.

The presence of the modified JTAG cell 500 is particular important as output of the sense amplifiers since allows:

Using the boundary scan as method to check the interconnection between the SoC 10 and the Flash Array component 1;

Implement the Direct Memory Access connecting directly the sense amplifier with the controller;

It allows to leave the sense amplifier to prepare the second 256 bit wide page plus the address plus the ECC and written close to the page.

Figure 6:
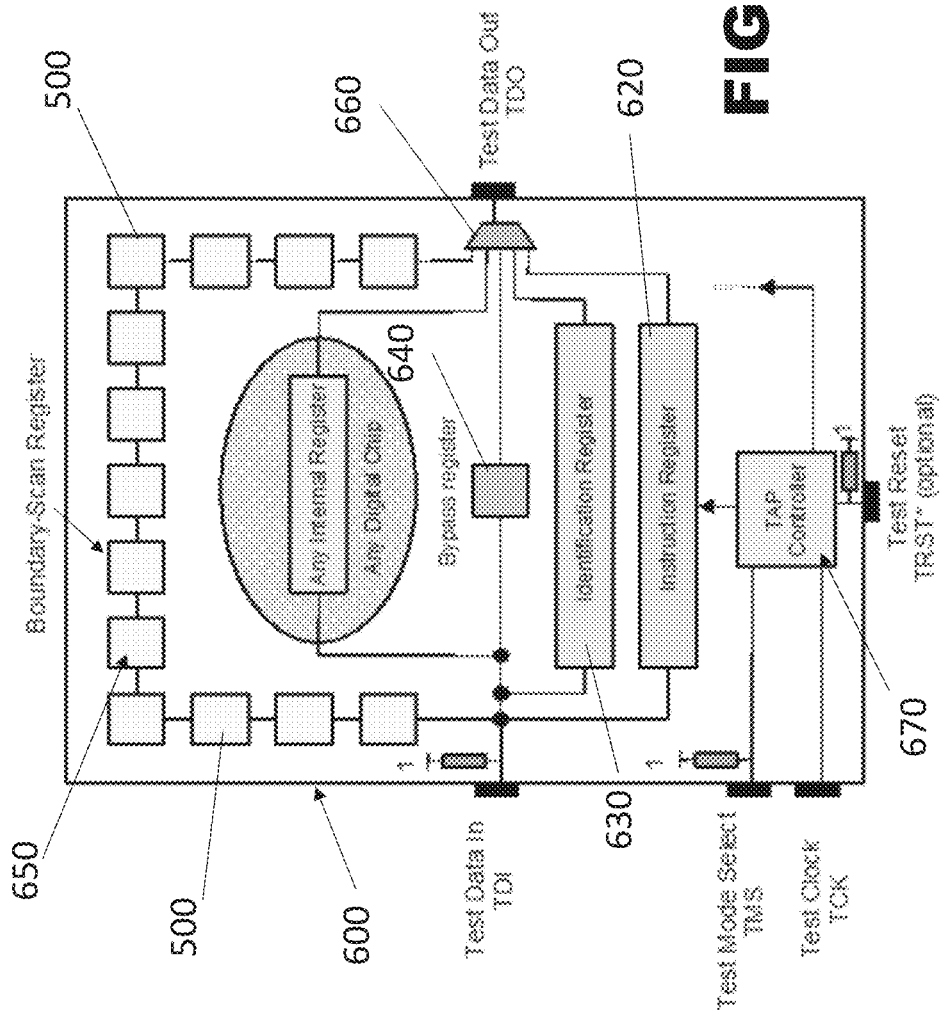
FIG. 6 shows a schematic view of a standard structure architecture using boundary-scan cell configured according to the IEEE standard No. 1149.1 but including the modified JTAG cells of FIG. 5.

Another advantage is given by the possibility to adopt a boundary-scan test architecture including modified JTAG cells 500 thus obtaining a new and peculiar boundary-scan test architecture like the one shown in the schematic view of FIG. 6. This is a further advantage since for this test only one output driven is needed and this is obtained using the signal TCK and the data stored in the cells. The scan chain test requires the SoC 10 to test the output of the scan chain.

As it is known in this specific technical field, boundary scan is a family of test methodologies aiming at resolving many test problems: from chip level to system level, from logic cores to interconnects between cores, and from digital circuits to analog or mixed-mode circuits.

The boundary-scan test architecture 600 provides a means to test interconnections between the integrated circuits 1 and 10 on a board without using physical test probes. It adds a boundary-scan cell 500 that includes a multiplexer and latches, to each pin or pad on the device.

In other words, each primary input signal and primary output signal of a complex semiconductor device like the memory component 1 or the host device 10 is supplemented with a multi-purpose memory element called a boundary-scan cell that, altogether, form a serial shift register 650 around the boundary of the device.

Originally, those boundary-scan cells have been introduced as a means of applying tests to individual semiconductor devices. The use of boundary-scan cells to test the presence, orientation, and bonding of devices in place on a circuit board was the original motivation for inclusion in a semiconductor device.

According to the present disclosure the boundary-scan cells 500 are also used to test the interconnections between integrated circuits that work together such as the System-on-Chip 10 with the associated memory component 1, as is the case of the present disclosure.

The collection of boundary-scan cells is configured into a parallel-in or parallel-out shift register and the boundary-scan path is independent of the function of the hosting device. The required digital logic is contained inside the boundary-scan register. Obviously, an external JTAG FSM interacts with the cells, i.e. shiftDR, shiftIR, UpdateDR, etc. are driven by the JTAG logic 300.

To summarize very briefly the functioning of a boundary-scan cell it may be said that each cell 500 is structured for capturing data on its parallel input PI; updating data onto its parallel output PO; serially scanning data from its serial output SO to its neighbor's serial input SI. Moreover, each cell behaves transparently, in the sense that PI passes to PO.

FIG. 6 shows a schematic view of a standard structure architecture using boundary-scan cells configured according to the IEEE standard No. 1149.1. However, according to the present disclosure, the boundary-scan cells used in the architecture 600 are the modified JTAG cells 500 previously disclosed.

A JTAG interface is a special interface added to a chip. According to present embodiments, two, four, or five pins are added allowing to expand the JTAG according to the need of the present implementation.

The connector pins are: TDI (Test. Data In); TDO (Test Data Out); TCK (Test Clock); TMS (Test Mode Select) and an optional TRST (Test Reset).

The TRST pin is an optional active-low reset to the test logic, usually asynchronous, but sometimes synchronous, depending on the chip. If the pin is not available, the test logic can be reset by switching to the reset state synchronously, using TCK and TMS. Note that resetting test logic doesn't necessarily imply resetting anything else. There are generally some processor-specific JTAG operations which can reset all or part of the chip being debugged.

Since only one data line is available, the protocol is serial. The clock input is at the TCK pin. One bit of data is transferred in from TDI, and out to TDO at each TCK rising clock edge. Different instructions can be loaded. Instructions for typical ICs might read the chip ID, sample input pins, drive (or float) output pins, manipulate chip functions, or bypass (pipe TDI to TDO to logically shorten chains of multiple chips).

As with any clocked signal, data presented to TDI must be valid for some chip-specific Setup time before and Hold time after the relevant (here, rising) clock edge. TDO data is valid for some chip-specific time after the falling edge of TCK.

FIG. 6 shows a set of four dedicated test pins—Test Data In (TDI), Test Mode Select (MIS), Test Clock (TCK), Test Data Out (TDO)—and one optional test pin Test Reset (TRST).

These pins are collectively referred as a Test Access Port (TAP).

However, the architecture 600 includes a finite-state machine, named TAP controller 670, with receives as inputs three signals: TCK, TMS, and TRST. The TAP controller 670 is a 16-state final state machine FSM that controls each step of the operations of boundary scan architecture 600. Each instruction to be carried out by the boundary scan architecture 600 is stored in the Instruction Register 620.

FIG. 6 shows a plurality of boundary-scan cells 500 on the device primary input and primary output pins. The cells 500 are connected internally to form a serial boundary-scan register 650. In other words, the modified JTAG cells 500 are used as building blocks of the boundary scan architecture 600.

Data can also be shifted around the boundary-scan shift register 650 in serial mode, starting from a dedicated device input pin called "Test Data In" (TDI) and terminating at a dedicated device output pin called "Test. Data Out" (TDO) at the output of a multiplexer 660.

The test clock, TCK, is selectively sent to each register depending on the TAP state and to the register selection; the fed of the TCK signal is performed via a dedicated device input pin and the mode of operation is controlled by a dedicated "Test Mode Select" (TMS) serial control signal.

The Instruction. Register (IR) 620 includes n-bit (with n≥2) and is implemented for holding each current instruction.

In line with the IEEE 1149 standard the architecture is completed by a 1-bit bypass register 640 (Bypass); an optional 32-bit Identification Register 630 (Ident), capable of being loaded with a permanent device identification code.

At any time, only one register can be connected from TDI to TDO (e.g., IR, Bypass, Boundary-scan, Ident, or even some appropriate register internal to the core logic). The selected register is identified by the decoded output of the IR. Certain instructions are mandatory, such as Extest (boundary-scan register selected), whereas others are optional, such as the Idcode instruction (Ident register selected).

A parallel load operation is called a "capture" operation and causes signal values on device input pins to be loaded into input cells and signal values passing from the core logic to device output pins to be loaded into output cells.

A parallel unload operation is called an "update" operation and causes signal values already present in the output scan cells to be passed out through the device output pins. Moreover, a PAUSE instruction permits to hold the data in the register even if it is not completed.

Depending on the nature of the input scan cells, signal values already present in the input scan cells will be passed into the core logic.

Now, in one embodiment of the present disclosure, the boundary-scan architecture 600 is completed with a further or additional register 780 that is specifically provided to manage the memory component 1. This additional register 780 is also definable by the user. This expansion is allowed by the IEEE 1532 standard.

Figure 7:
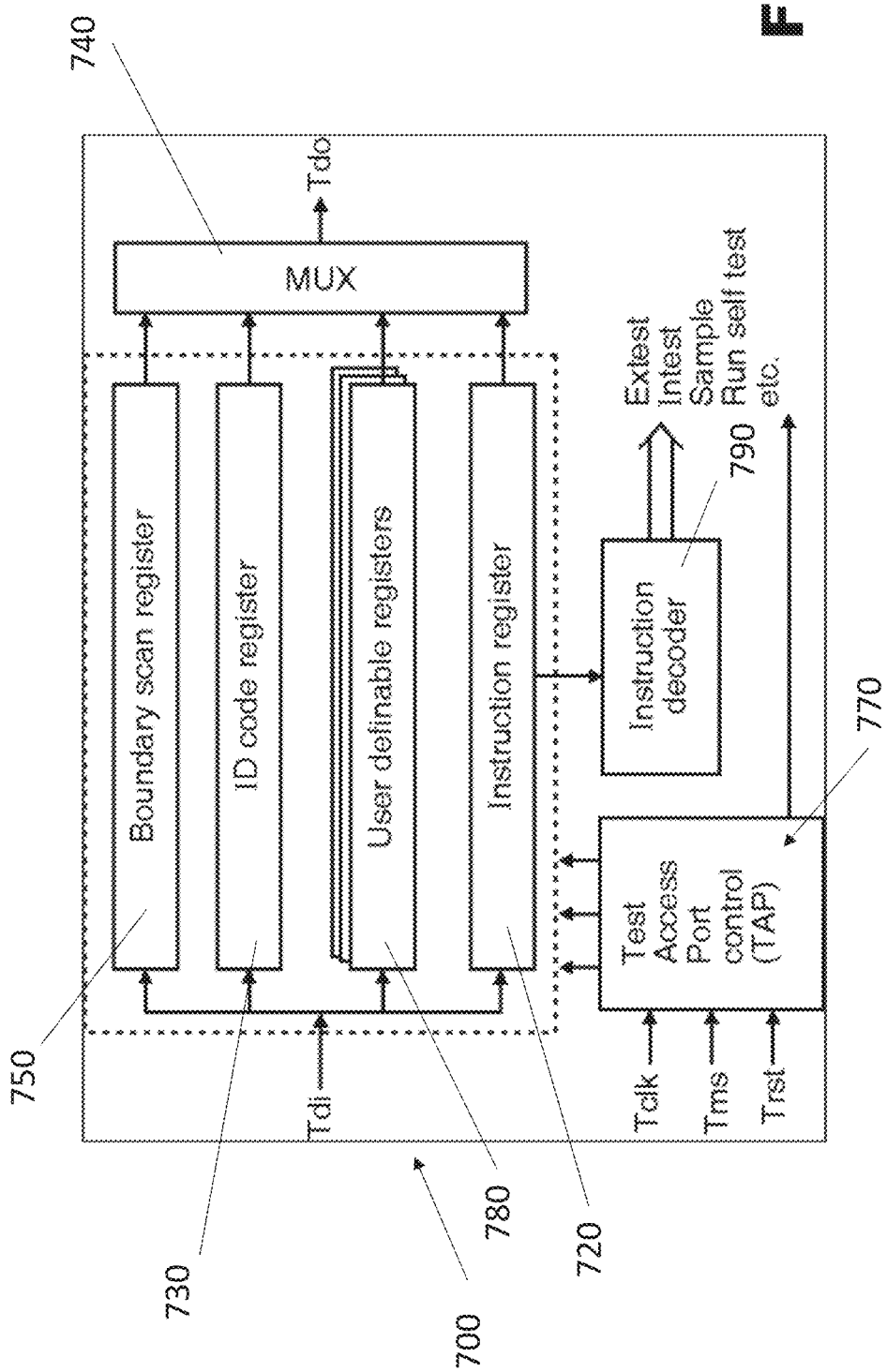
FIG. 7 is a diagram showing schematically in greater details the composition of registers incorporated into a boundary-scan architecture of the present disclosure.

FIG. 7 shows in greater details the composition of the registers incorporated into the boundary-scan architecture 600 of the present disclosure. In this FIG. 7 the boundary-scan shift register 750 is coupled to the TDI pin in serial mode and provides an output toward the TDO output pin via the multiplexer 740.

The test clock, TCK, is fed in via yet another dedicated device input pin and the mode of operation is controlled by a dedicated "Test Mode Select" (TMS) serial control signal both applied to the TAP controller 770.

The various control signals associated with the instruction are then provided by a decoder 790.

The Instruction. Register (IR) 720 includes n-bit (with n≥2) and is implemented for holding each current instruction. The architecture includes a 1-bit bypass register (not shown in FIG. 7) and the Identification. Register 730.

The additional register 780 is used as shift data register for allowing the interaction with the core of the host device in the writing and/or reading phases of the memory component. However, the user definable register can even be different. Depending on the command loaded in the IR, different register can be combined. For instance, to program the memory it may be necessary to dispose of at least: a data register with size the min. page to be programmed in the memory array, a data address that contains which address can be loaded and, optionally, a mask register to avoid touching a portion of the data, among other things.

w, the command user interface represented by the TAP controller 670 or 770 is based on the IEEE1149 and IEEE1532 standards, that implement a low signal count interface, i.e. TMS, TCK, TDI, TDO, TRST (Optional) with capability to modify the internal content of the associated memory sub array 200.

Another advantage is given by the possibility to adopt a boundary-scan test architecture including modified JTAG cells 500 thus obtaining a new and peculiar boundary-scan test architecture like the one shown in the schematic view of FIG. 6. Moreover, for this test you need only one output driven and this is done using the TCK and the data stored in the cells, for instance when the scan chain test requires the SoC to test the out of the scan chain.

To summarize very briefly the functioning of a boundary-scan cell it may be said that each cell 500 is structured for capturing data on its parallel input PI; updating data onto its parallel output PO; serially scanning data from its serial output SO to its neighbor's serial input SI. Moreover, each cell behaves transparently, in the sense that PI passes to PO.

As shown in FIG. 8, the standard IEEE1149.1 is based on a finite state machine, i.e. including sixteen states, and two of them, i.e. shift instruction register (ShiftIR) and shift data register (ShiftDR), allows the interaction with the system in write and read.

FIG. 8 shows schematically the Test Access Port TAP 800 as a Finite State Machine taking care of all the operations concerning the testing of an integrated circuit such as a memory device.

The sequence of logic signals "0" and "1" applied to the TMS pin controls the operation of the chip architecture through the boundary scan structure.

Let's first consider to start from the test logic reset state indicated with the number 810 when the circuit is powered up. In this specific state all the boundary scan cells are in a so-called transparent condition with the parallel input PIN connected internally to the parallel output POUT and all the input pins are connected to the core of the integrated circuit.

By driving an appropriate sequence of logic values "1" and "0" as TMS signal it is possible to set the output multiplexer in such a manner that the TDI input is shifted as the first instruction to obtain the output TDO. The TMS signal should drive the TAP FSM in state ShiftDR or ShiftIR to connect the TDI and the TDO to a register.

To shift an instruction we need to go to the state ShiftIR with number 830 and to reach that state we need to apply the following sequence; setting 0 as TMS and driving one clock pulse to TCK we reach the Run/Idle state 820.

Selecting now a "1" from the state 820 we pass to a selection of a Data Register scan 840 and to an. Instruction. Register scan 845. With a further "0" on the TMS we can reach the Capture phase of the Instruction Register 850.

The capture phase allows catching to two final Bits of the Instruction Register 720 in FIG. 7; as said the capture operation uses the parallel input.

A further "0" drives to the Shift IR that allows to pass the input value TDI to the output TDO; the TDI value at the input appears after a number of clocks equal to register size.

Keeping the TMS to "0" we may remain in the Shift IR state 830 allowing to shift the bits received on the TDI pin to the output TDO.

It is possible to remain in that state 830 for all the clock cycle needed to shift all the input bits.

We remain in the ShiftIR state 830 for a number of clock cycle corresponding to the number of bits of the IR 720 minus one. At the end of the sequence the Exit-1 IR state 855 is reached.

From this exit state 855 we will move to an update state 860 driving a "1" TMS and this is the moment when the new instruction become valid. The boundary scan cells are reverted to test mode wherein the input pins are isolated from the core circuitry.

It is now possible to send the test vector to the core circuitry by reaching the Shift DR state 870.

The states of the Data Register are similar to the states of the Instruction Registers.

Therefore, with the sequence 1-0-0 we can reach the ShiftDR state 870.

Passing through the Capture DR 875 the first multiplexer MO1 of the boundary scan cell is connected to the parallel input PIN and all the input pins of the boundary scan register have captured their input value.

Going now to the Shift DR 870 the multiplexer changes its state allowing to catch the serial input SIN and the scan path is shifted from the TDI input through the boundary scan register to the output pin TDO.

The circuit remains in this state for a number of clock cycle corresponding to the number of boundary scan cells minus one; obviously, the boundary scan is one of the possible data register selected with a proper instruction in the IR register.

The new test vector comes out to the output pins when the Exit-1. DR 880 state is passed and the Update DR state 885 is reached.

The sequence is repeated going from update to capture to allow a new test vector to be introduced into the circuitry.

As we have seen, the TAP includes test data input and test data output and a clock signal. More particularly, the shift data register ShiftDR reports a state where the TDI is connected with a register. In that state the register content is transferred in and/or out of the device.

Similarly, the shift instruction register ShiftIR also reports a state where the TDI is connected with a register. Instruction are loaded in that state.

For completeness sake, it should be noted that the JTAG state machine can be used to reset a register, to access an instruction register, or to access the data selected by the instruction register.

Due to the requirement of having multiple core inside the host device 10, the internal register 780 of the JTAG interface must be able to support up to address and data registers. In particular, the generation of four address registers (one from each sub-array 220) is provided to be filled with a different address for each sub array 220 and triggering four different data out for the read register [0:3], per sub-array section. The communication to the SoC happens connecting the selected Read Register, i.e. the output named POUT [127:0], directly to input of the channel of the host device or SoC 10.

This mechanism allows to pre-load the data for the controller, reducing the latency time to a very low value.

According to the present disclosure, the additional register 780 is used to reduce, or even nullify, the data read initial latency.

In particular, according to an embodiment of the present disclosure, the SoC uses the eXecution In Place (XiP) as method to retrieve the data from the memory component; in this way, the initial address is always fixed.

The memory component of the present disclosure is advantageously structured in such a way that the default initial address can be pre-programmed in a custom way. The pre-programming is done by using a specific command set, such as Default_Address_Load0_0, . . . , Default_Address_Load3_3.

According to an advantageous embodiment of the present disclosure, the default initial addresses is stored in the additional register 780. In this way, at the power on of the apparatus, the pre-programmed default address is transferred from the additional register 780 to the JTAG registers. Soon after the default address is loaded, a read sequence in each sub-array is executed to prepare the data needed to each core. Suitably, this avoids the initial latency of the system after the boot.

Figure 9:
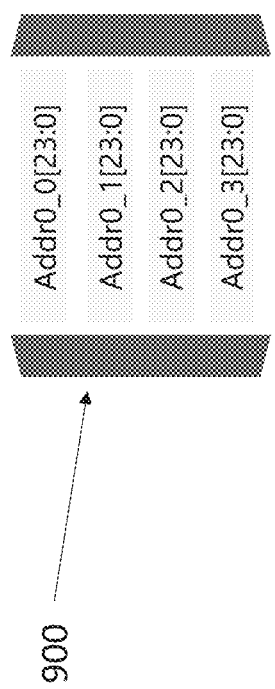
FIG. 9 is a schematic view of address registers of a sub-array according to the present disclosure.

As shown in FIG. 9, each sub-array 900 contains a set of 4 address registers, i.e. 24 bits wide, and a set of 4 data out registers, i.e. 128+16+24 wide.

The address registers of the sub arrays are connected to data buffer registers and, as shown above, the memory device of the present disclosure can store, in a non-volatile manner, the initial address that is read at the boot of the system. In this way, since XiP reads are performed at the boot of the system, the initial address of the XiP is fixed and programmed during the configuration of the SoC/Flash Array apparatus, such address stored in the additional register being used by the XiP at boot.

The advantage to have the addresses stored, for each subarray, in the address buffers is that a read operation can be triggered to nullify the initial latency of the SoC.

In other words, according to the present disclosure, the user is able to store in the additional register 780 a page address of the sub arrays, so that, at the power-on, an automatic reading sequence is executed to read the desired page at the stored address and make the corresponding data (address & ECC) available to the user for immediate use. This allows time saving at power-on, by reading and making available the desired page—for each sub array—the address of which is stored in the additional register.

The additional register may be a single register, or it may include a plurality of registers, one for each sub array. The additional register of the JTAG interface is therefore configured to store a plurality of page addresses corresponding to a plurality of address registers of the sub arrays triggering at least a corresponding plurality of different data from said read interface.

Figure 10:
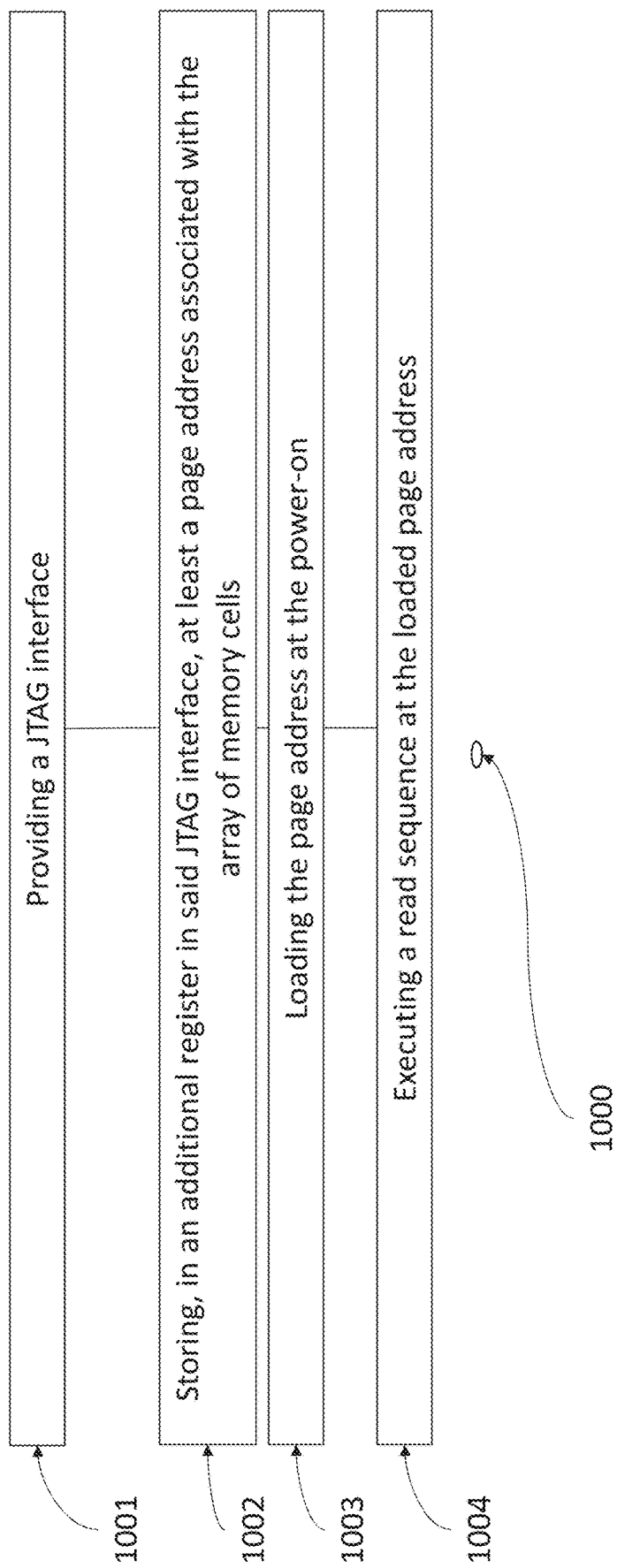
FIG. 10 shows a diagram of a method 1000 according to the present disclosure.

The initial addresses can be stored using JTAG commands, i.e. following a flow like:
Shift IR: Initial_Address_Load
Shift DR: address+sub-array+address out of 4
RUN_TEST_IDLE:
Shift IR: Program_Flash_Array
RUN_TEST_IDLE FIG. 10 shows a diagram of a method 1000 according to the present disclosure.

In particular, the method comprises a first step 1001 of providing a JTAG interface. This step is followed by a second step 1002 of storing, in an additional register in said JTAG interface, at least a page address associated with the array of memory cells, and by a step 1003 of loading said page address at the power-on of the apparatus. A step 1004 of performing a read sequence at the page address is finally provided.

JTAG platforms often add signals to the handful defined by the IEEE 1149.1 specification. A System. Reset (SRST) signal is quite common, letting debuggers reset the whole system, not just the parts with JTAG support. Sometimes there are event signals used to trigger activity by the host or by the device being monitored through JTAG; or, perhaps, additional control lines.

In JTAG, devices expose one or more test access ports (TAPs).

To use JTAG, a host is connected to the target's JTAG signals (TMS, TCK, TDI, TDO, etc.) through some kind of JTAG adapter, which may need to handle issues like level shifting and galvanic isolation. The adapter connects to the host using some interface such as USB, PCI, Ethernet, and so forth. However, according to the present disclosure the SoC is able to drive the JTAG TAP in the memory also without external aid.

The host device 10 communicates with the TAPs by manipulating the signals TMS and TCK (or also TRST if present). The signal TDI is used only to load register data reading then the results through TDO (which is the only standard host-side input). TMS/TDI/TCK output transitions create the basic JTAG communication primitive on which higher layer protocols build:

State switching: wherein all TAPs are in the same state, and that state changes on TCK transitions. All the TAP FSM are moving accordingly because the TMS is connected at the same time to all the JTAG compliant devices, fi they are present in the board.

Referring again to FIG. 8, this JTAG state machine is part of the JTAG specification and includes sixteen states. There are six "stable states" where keeping TMS stable prevents the state from changing. In all other states, TCK always changes that state. In addition, asserting the signal TRST forces entry, thus bringing to the default value all the content of the registers. Their content is not anymore valid and it should be reloaded to one of those stable states (Test_Logic_Reset) in a slightly quicker way than the alternative of holding TMS high and cycling TCK five times.

Shifting phase: wherein most parts of the JTAG state machine support two stable states used to transfer data. Each TAP has an instruction register (IR) and a data register (DR). The size of those registers varies between TAPs, and those registers are combined through TDI and TDO to form a large shift register. (The size of the DR is a function of the value in that TAP's current IR, and possibly of the value specified by a SCAN_N instruction.)

Usually there is an optional register to define the size of the data registers. The IR is checked using the standard since the low significant bits are loaded with 1 and 0. This allows to count the number of JTAG devices in the network and having knowledge of the size of each TAP IR, that can be different.

There are three operations defined on that shift register:
Capturing a temporary value.
Entry to the Shift_IR stable state goes via the Capture_IR state, loading the shift register with a partially fixed value (not the current instruction)
Entry to the Shift_DR stable state goes via the Capture_DR state, loading the value of the Data Register specified by the TAP's current IR.

Shifting that value bit-by-bit, in either the Shift_IR or Shift_DR stable state; TCI transitions shift the shift register one bit, from TDI towards TDO, exactly like a SPI mode 1 data transfer through a daisy chain of devices with TMS=0 acting like the chip select signal, TDI as MOST, etc.).

Updating IR or DR from the temporary value shifted in, on transition through the Update_IR or Update_DR state. The PAUSE state is also relevant as part of the standard in each side of the shift branch.

Note that it is not possible to read (capture) a register without writing (updating) it, and vice versa. A common idiom adds flag bits to say whether the update should have side effects, or whether the hardware is ready to execute such side effects.

Running state: wherein one stable state is called Run_Test/Idle. The distinction is TAP-specific. Clocking TCI in the Idle state has no particular side effect, but clocking it in the Run_Test state may change system state. For example, some cores support a debugging mode where TCI cycles in the Run_Test state drive the instruction pipeline.

So, at a basic level, using JTAG involves reading and writing instructions and their associated data registers; and sometimes involves running a number of test cycles. Behind those registers is hardware that is not specified by JTAG, and which has its own states that is affected by JTAG activities.

JTAG Finite State Machine is triggered at the rising edge of the TCK, the clock signal and provides output at the falling edge. This allows to use the bypass register and not losing clock cycles in the scan-chain.

The TMS signal is checked and its value triggers the state transition.

The ShiftDR and ShiftIR state are addressing 10 registers and the TDI signal is used to serial insert data inside the selected register The IR Register is used to select the specific data register and/or the instruction to be used.

When the state machine is in run-test/idle, the IR register is checked for a command and it is executed, using the data of eventual service registers, i.e. a program command can use the data register and the address register to decide what and where the data must be stored.

JTAG boundary scan technology provides access to many logic signals of a complex integrated circuit, including the device pins. The signals are represented in the boundary scan register (BSR) accessible via the TAP. This permits testing as well as controlling the states of the signals for testing and debugging. Therefore, both software and hardware (manufacturing) faults may be located and an operating device may be monitored.

The present disclosure obtains many advantages reported hereinafter not in order of importance. The solution previously disclosed reduces the cost of the silicon for the memory component and improve the overall quality and reliability issues for the whole apparatus including the host device and memory component.

The apparatus of the present disclosure offers a good option for realizing Real Time Operative Systems (RTOS), especially in the Automotive segment, providing a low initial latency, especially at system boot, in the first access of the memory component.

Moreover, the memory architecture previously disclosed provides for a very high quality and an error rate in the range of less than 1 part per million.

Finally, the disclosed architecture allows adopting an aggressive lithography node in the host device and the latest flash memory technology in the memory component decoupling both technologies allowing to realize the best integrated circuit for both devices in place.

The memory component 1 and the host or SoC 10 have been coupled with an interface using a very high parallelism. This feature can be used also to improve the performance, for instance to load the Instruction Register and the (generic) Data Registers.

For instance, if we make reference to the example of FIG. 7, it may be appreciated that the instruction register 720 can be loaded in a single clock cycle connecting in parallel the DATAx to the memory cells. Moreover, FIG. 8 is showing the TAP transitions, driven by the TMS signal when the state ShiftDR or ShiftIR are reached; the figure shows two cases of flexible TDI, one data register of 8 bits and another data register of 128 bits.

The Data0 can be used as default, but in case that the SoC cannot manage the single DATA0 for all the communication a mux can be added for each channel of the controller, i.e. when the channel0 is addressed DATA0, when channel1 Data1, etc.

The Data0 can load in parallel all the sub-array read registers in case of concurrent programming.

The IEEE 1.149 defines a serial protocol. The Instruction Register 720 of at least two bits is used also as discovery method.

The host can move the JTAG FSM to the ShiftIR mode and, then, start to shift in a known codeword, when the whole serial chain is passed the codeword appears to the TDI of the host. The host can count the combination "10" and be aware of:
 # of devices in the chain
 Length of the Instruction register of each device The flexible TDI was thought to improve the performance of certain operation, i.e. a data register containing 128 bits can be loaded using the whole DATA I/O capability of the sub-array. The output will be always compatible with the JTAG, but it will be only one bit, i.e. the less significant bit of the data register.

The instruction register requires a specific attention, because it must be at least 2 bits wide, so in the case that the Instruction Register is 8 bit, the implementation of the flash array forecasts a communication using 2 clock cycles, to allow the sequence '10' to be sent to the next device.

The proposed methodology is not the default of the device, but it will be selectable in a volatile configuration register bit, so the user can configure the device to operate in Flexible TDI all the times.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

The invention claimed is:

1. An apparatus comprising:
 a memory component having an independent structure and including at least an array of memory cells with associated decoding and sensing circuitry of a read interface, wherein the memory component further includes a plurality of sub-arrays with a read interface including a plurality of sense amplifiers and a data buffer;
 a host device coupled to the memory component through at least a communication channel;
 a JTAG interface in said at least an array of memory cells;
 at least an additional register in said JTAG interface for handing data, addresses and control signals provided by the host device,
 wherein said additional register is configured to store at least a plurality of page addresses corresponding to a plurality of address registers of the plurality of sub-arrays associated with the array of memory cells,
 wherein the plurality of address registers trigger at least a corresponding plurality of different data from the read interface,
 wherein the memory component is configured to load said plurality of page addresses at the power-on of the apparatus, and
 wherein the host device is configured to perform a read sequence at said plurality of page addresses.

2. The apparatus of claim 1, wherein the additional register includes a plurality of registers, each register including data corresponding to a respective sub-array.

3. The apparatus of claim 1, wherein said data buffer includes a plurality of modified JTAG cells coupled to corresponding outputs of said sense amplifiers.

4. The apparatus of claim 1, wherein each sense amplifier is connected directly to a modified JTAG cell to integrate a JTAG structure and the sense amplifiers in a single circuit portion.

5. The apparatus of claim 1, wherein said memory component includes at least four sub arrays and each sub array is independently addressable inside the memory component.

6. The apparatus of claim 1, wherein a scan-chain is formed by serially interconnecting the JTAG cells of said data buffer.

7. The apparatus of claim 1, wherein the output of said at least an array of memory cells is formed combining the data cells, address cells and ECC cells.

8. The apparatus of claim 1, wherein said host device includes a plurality of cores and each core is coupled to a communication channel for independently receiving and transferring data to the memory component.

9. The apparatus of claim 1, wherein the host device is configured to retrieve the data from the memory component via eXecution In Place (XiP).

10. The apparatus of claim 1, wherein each sub-array comprises a set of four address registers, and a set of four data out registers.

11. A non-volatile memory device including:
   at least a memory array with associated decoding and sensing circuitry of a read interface, wherein the read interface includes sense amplifiers and a data buffer;
   a plurality of sub-arrays in said memory array structured to be in communication with a communication channel through a read interface;
   a JTAG interface in said at least a memory array;
   at least an additional register in said JTAG interface for handing data, addresses and control signals provided from said communication channel,
   wherein said additional register is configured to store at least page addresses associated with the array of memory cells, generate four address registers with corresponding different addresses, and trigger four different data from the read interface of each sub-array of the plurality of sub-arrays, and
   wherein the memory component is configured to load said page addresses to be read at the power-on of the apparatus.

12. The non-volatile memory device of claim 11, wherein said JTAG interface includes a JTAG state machine structured to reset or access an instruction register as well as to access data selected by the instruction register.

13. The non-volatile memory device of claim 11, wherein said JTAG interface receives as inputs standard JTAG signals: TMS, T'CK, TDI as well as data from a memory page.

14. The non-volatile memory device of claim 11, wherein said control and JTAG interface produces as output data, addresses and control signals that are transferred to a memory address decoder and to said memory controller to perform modify operations.

15. The non-volatile memory device of claim 11, including at least four memory sub arrays and each sub array is independently addressable inside the memory device.

16. The non-volatile memory device of claim 11, wherein the memory is structured to be in communication with a plurality of cores of a host or SoC device through corresponding communication channels and wherein a selected read register of the memory device is connected directly to the input of a corresponding channel of the host device for independent receiving and transferring data.

17. The non-volatile memory device of claim 11, wherein the memory array is a NAND Flash memory array.

18. A method to boot an apparatus comprising a memory component including at least an array of memory cells, and a host device coupled to the memory component, the method comprising:
   providing a JTAG interface;
   storing, in an additional register in said JTAG interface, at least a plurality of page addresses corresponding to a plurality of address registers of a plurality of sub-arrays of the array of memory cells;
   triggering a corresponding plurality of different data from a read interface using said plurality of address registers;
   loading said plurality of page addresses at the power-on of the apparatus; and
   performing a read sequence at the page addresses.

19. The method of claim 18, wherein the page addresses are stored in the additional register using JTAG commands.

20. The apparatus of claim 18 wherein execution In Place (XiP) is used to perform the read sequence, initial addresses of the XiP being the page addresses programmed and stored in the additional register.

21. The method of claim 18, wherein, at the power on, the step of reading, for each sub-array, the pages at the corresponding page addresses makes data available for immediate use.

* * * * *